United States Patent
Goel et al.

(10) Patent No.: US 10,871,518 B2
(45) Date of Patent: Dec. 22, 2020

(54) SYSTEMS AND METHODS FOR DETERMINING SYSTEMATIC DEFECTS

(71) Applicant: Taiwan Semiconductor Manufacturing Company, Ltd., Hsinchu (TW)

(72) Inventors: Sandeep Kumar Goel, Hsinchu (TW); Yun-Han Lee, Hsinchu (TW); Ankita Patidar, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 196 days.

(21) Appl. No.: 16/129,433

(22) Filed: Sep. 12, 2018

(65) Prior Publication Data

US 2019/0113573 A1  Apr. 18, 2019

Related U.S. Application Data

(60) Provisional application No. 62/565,402, filed on Sep. 29, 2017.

(51) Int. Cl.
*G01R 31/3185* (2006.01)
*G11C 29/14* (2006.01)
*G11C 29/32* (2006.01)

(52) U.S. Cl.
CPC ........... *G01R 31/318544* (2013.01); *G01R 31/318541* (2013.01); *G11C 29/14* (2013.01); *G11C 29/32* (2013.01); *G01R 31/31853* (2013.01)

(58) Field of Classification Search
CPC .... G01R 31/318544; G01R 31/318541; G01R 31/31853; G11C 29/32; G11C 29/14
See application file for complete search history.

(56) References Cited

U.S. PATENT DOCUMENTS

| | | | |
|---|---|---|---|
| 2003/0106003 A1* | 6/2003 | Whetsel | G01R 31/3177 714/729 |
| 2003/0208721 A1* | 11/2003 | Regnier | G06F 30/33 716/106 |

(Continued)

OTHER PUBLICATIONS

J. Ye et al., "Diagnosis and Layout Aware (DLA) Scan Chain Stitching," in IEEE Transactions on Very Large Scale Integration (VLSI) Systems, vol. 23, No. 3, pp. 466-479, Mar. 2015. (Year: 2015).*

(Continued)

*Primary Examiner* — Cynthia Britt
(74) *Attorney, Agent, or Firm* — Merchant & Gould P.C.

(57) ABSTRACT

Methods and systems for determining a systematic defect in a circuit under test is provided. Elements of the circuit under test converted into scan cells. A first scan chain that includes a first plurality of scan cells is formed. Each scan cell of the first plurality of scan cells of the first scan chain are of a first cell type. The first scan chain contains a first scan input and a first scan output. A first test pattern is applied at the scan input and a first test output is collected for the applied first test pattern at the first scan output. The collected first test output is compared with a first expected test output. The first cell type is marked to be a suspect for a systematic defect when the first test output is different from the first expected test output.

20 Claims, 10 Drawing Sheets

(56) References Cited

U.S. PATENT DOCUMENTS

| | | | |
|---|---|---|---|
| 2008/0141085 A1* | 6/2008 | Dokken | G01R 31/318569 714/726 |
| 2011/0022908 A1* | 1/2011 | Wang | G01R 31/318544 714/726 |
| 2011/0191643 A1* | 8/2011 | Guo | G01R 31/318583 714/703 |
| 2013/0219237 A1* | 8/2013 | Ackerman | G01R 31/318569 714/727 |
| 2014/0115413 A1* | 4/2014 | Guo | G01R 31/318541 714/727 |
| 2018/0267098 A1* | 9/2018 | Kundu | G01R 31/318566 |

OTHER PUBLICATIONS

Y. Huang and W. Cheng, "On designing two-dimensional scan architecture for test chips," 2017 International Symposium on VLSI Design, Automation and Test (VLSI-DAT), Hsinchu, 2017, pp. 1-4. (Year: 2017).*

* cited by examiner

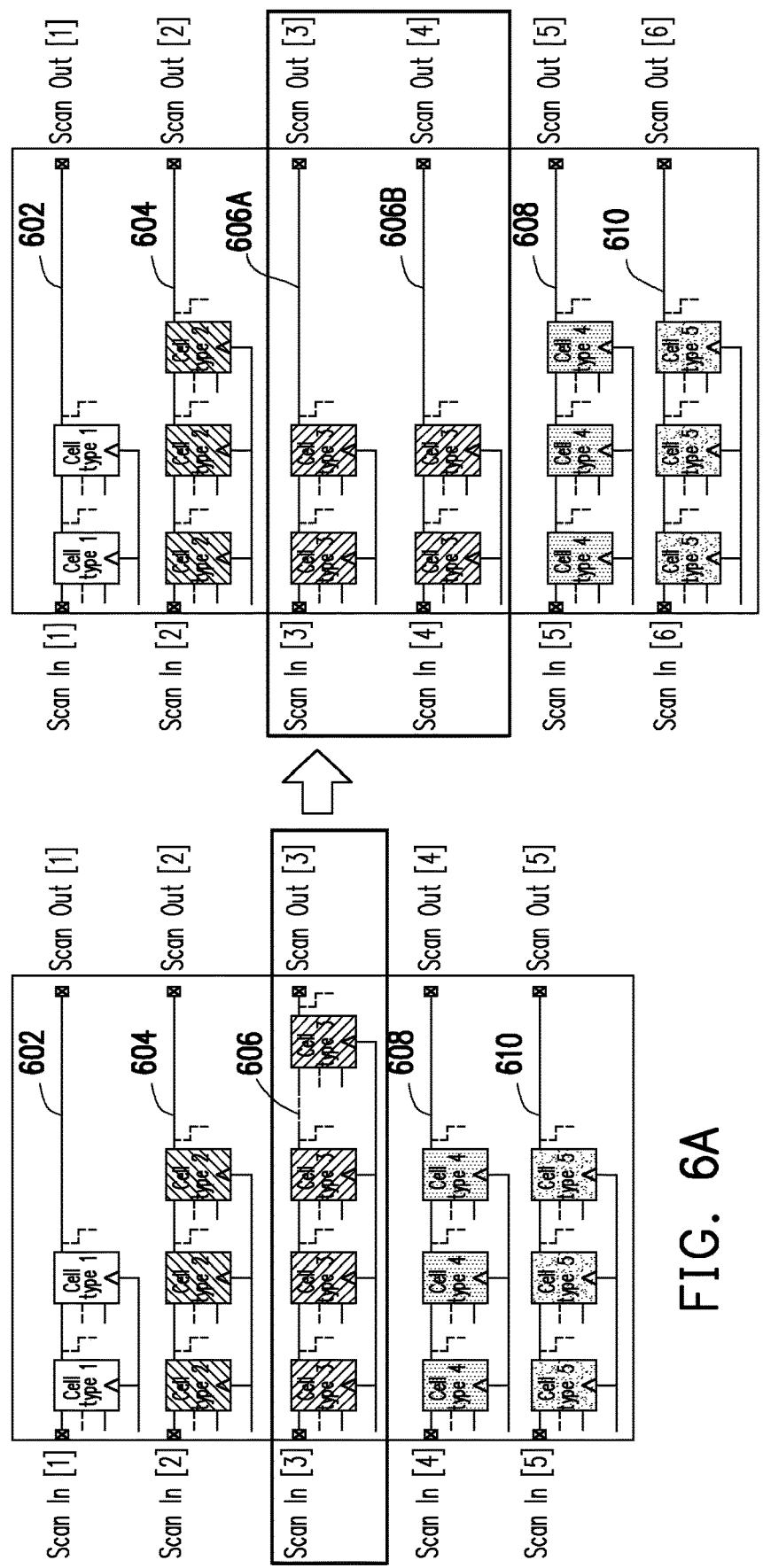

SYSTEMS AND METHODS FOR DETERMINING SYSTEMATIC DEFECTS

PRIORITY CLAIM AND CROSS-REFERENCE

This application claims priority to U.S. Provisional Patent Application No. 62/565,402 titled "Systems and Methods for Determining Systematic Defects" filed Sep. 29, 2017, the disclosure of which is hereby incorporated by reference in its entirety.

BACKGROUND

Fabrication of semiconductor devices, such as logic and memory devices, includes processing a substrate such as a semiconductor wafer using a large number of semiconductor fabrication processes to form various features and multiple layers of the semiconductor devices. Inspection processes are used at various steps during the semiconductor manufacturing process to detect defects on wafers. Another way to detect defects is scan based design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6B illustrates an example of splitting of scan chains, in accordance with some embodiments.

DETAILED DESCRIPTION

Figure 1:
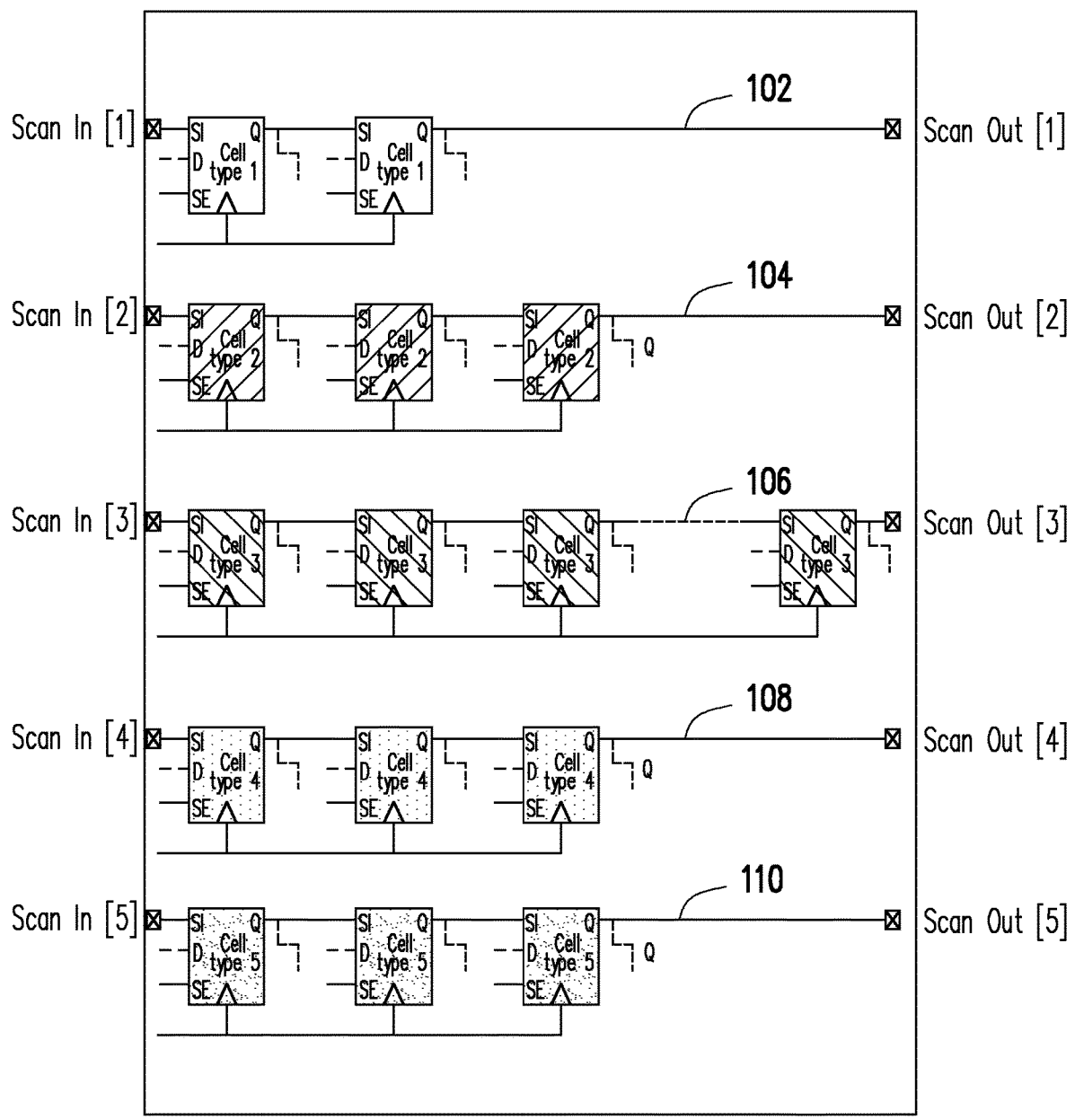
FIG. 1 illustrates example scan chains of a scan based design, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Disclosed below are representative embodiments of methods and systems for determining a systematic defect in a circuit. For example, the techniques disclosed herein locate the systematic defect related to sequential cells of a circuit. In example embodiments, the systematic defect is determined by forming one or more scan chains which include scan cells of the same cell type and testing the scan chains using one or more test patterns. Advantageously, the disclosed techniques help quickly identify which sequential cells are weak from process defects. These weak sequential cells are identified, isolated, or repaired to allow testing of the circuit with other scan cells.

In example embodiments, the systematic defect is determined using a scan based design for circuit testing (also referred to as a circuit under test or a CUT). In the scan based design, circuit elements (for example, memory or state elements) are first converted into scan elements (also referred to as scan cells). For example, a flip flop is converted into a scan flop. In example embodiments, the flip flop is converted into a scan flop by adding a predetermined number of additional pins on an input of the flip flop. A first additional input (also referred to as a signal input or a SI) is used for applying a test pattern (for example, an input stimulus, or a test vector). A second additional input (also referred to as a scan enable or a SE) is used for applying a scan enable signal.

After creating the scan cells, a selected number of scan cells are connected to form one or more scan chains. For example, a scan chain is created by connecting an output of a first scan cell to the signal input of a second scan cell, and so forth. The scan chain winds through the circuit under test. In example embodiments, each scan chain includes one signal input and one signal output.

During the testing, a test pattern is applied to the signal input of the scan chain. A test response (also referred to as an observed response or test output) of the scan chain is collected at the signal output. The test pattern includes, for example, a binary number of a predetermined length. The binary number could include all 1s, all 0s or a combination of 1s and 0s.

The observed response is compared with an expected response (also referred to as an expected output) for each test pattern. In example embodiments, when the observed response is different than the expected response, at least one scan cell of the scan chain is determined to be defective. To determine systematic defects, multiple scan chains using different orders and different numbers of scan cells are created. These scan chains do not mix. That is, the scan chains do not contain different scan cell types in the same scan chain. By using test patterns, if a scan chain containing one particular cell type fails more often than others, that cell type is identified as containing a systematic defect. In addition, fail signatures for the same scan cell type from different dies are combined to deduce if a particular cell type contains a systematic defect.

In an example embodiment, one or more scan cells containing a systematic defect is masked, or a complete scan chain containing such scan cells, is masked to allow further testing of the circuit under test. In another embodiment, the testing for the scan chain containing defective scan cells is bypassed to allow the testing of the circuit under test through other scan chains. In example embodiments, incremental mixing is used to determine inter-cell defects. In some example embodiments, predetermined cell type scan chains are formed containing scan cells of selected cell types while other scan chains may be allowed to include mixed cell type scan chains.

FIG. 1 illustrates examples of scan chains in accordance with some embodiments. For example, FIG. 1 illustrates five scan chains. Each of the respective scan chains comprises scan cells of the same respective cell type. For example, and as shown in FIG. 1, scan chain 102 includes cell type 1 scan cells. Moreover, and as shown in FIG. 1, scan chain 104 contains cell type 2 scan cells; scan chain 106 contains cell type 3 scan cells; scan chain 108 contains cell type 4 scan cells; and scan chain 110 contains cell type 5 scan cells. Further as shown in FIG. 1, each scan chains comprises a scan input point (shown as Scan In [ ]) and a scan output point (shown as Scan Out [ ]). A cell type is determined based on a design feature, a fabrication feature, or a circuit feature, for example.

Although FIG. 1 is illustrated to include one scan chain per cell type, it will be apparent to a person after reading this disclosure that more than one scan chains can be formed per cell type. For example, there could be more than one scan chain each containing the cell type 1 scan cells or the cell type 2 scan cells. In example embodiments, a number of scan chains per cell type may depend on a number of factors, such as, a number of scan cells for that cell type or a physical location (such as a distance) of the scan cells of that cell type.

Figure 2:
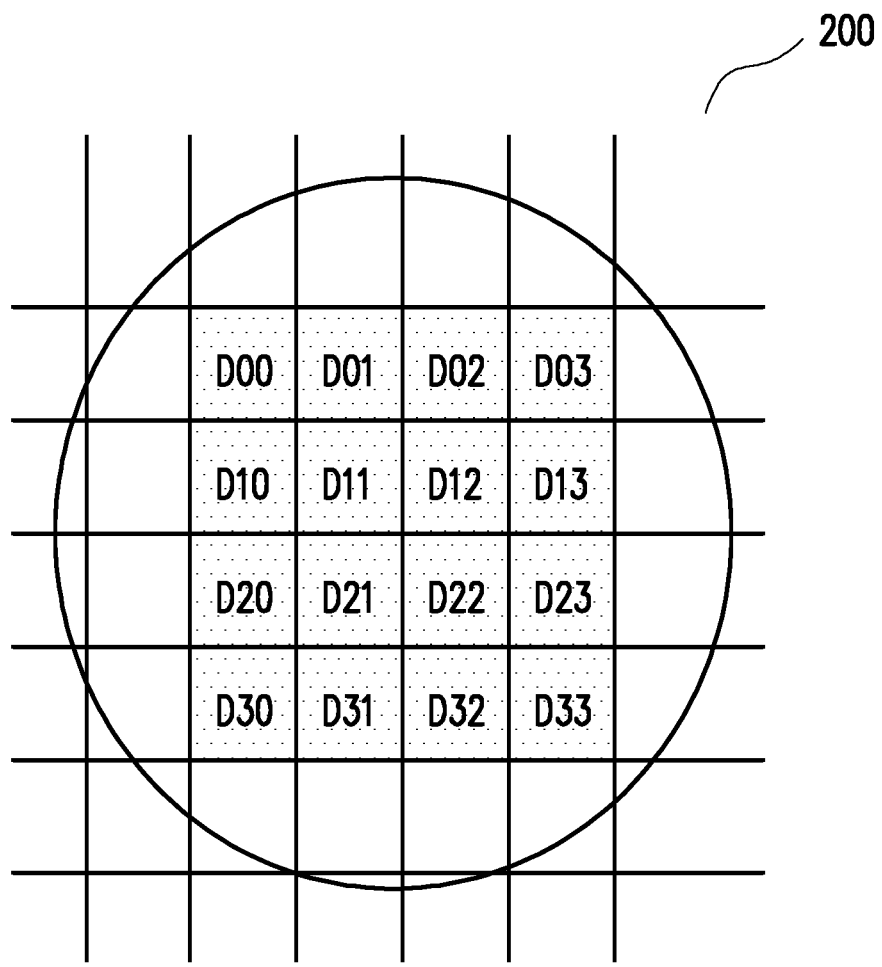
FIG. 2 illustrates dies of an example wafer, in accordance with some embodiments.
Figure 3:
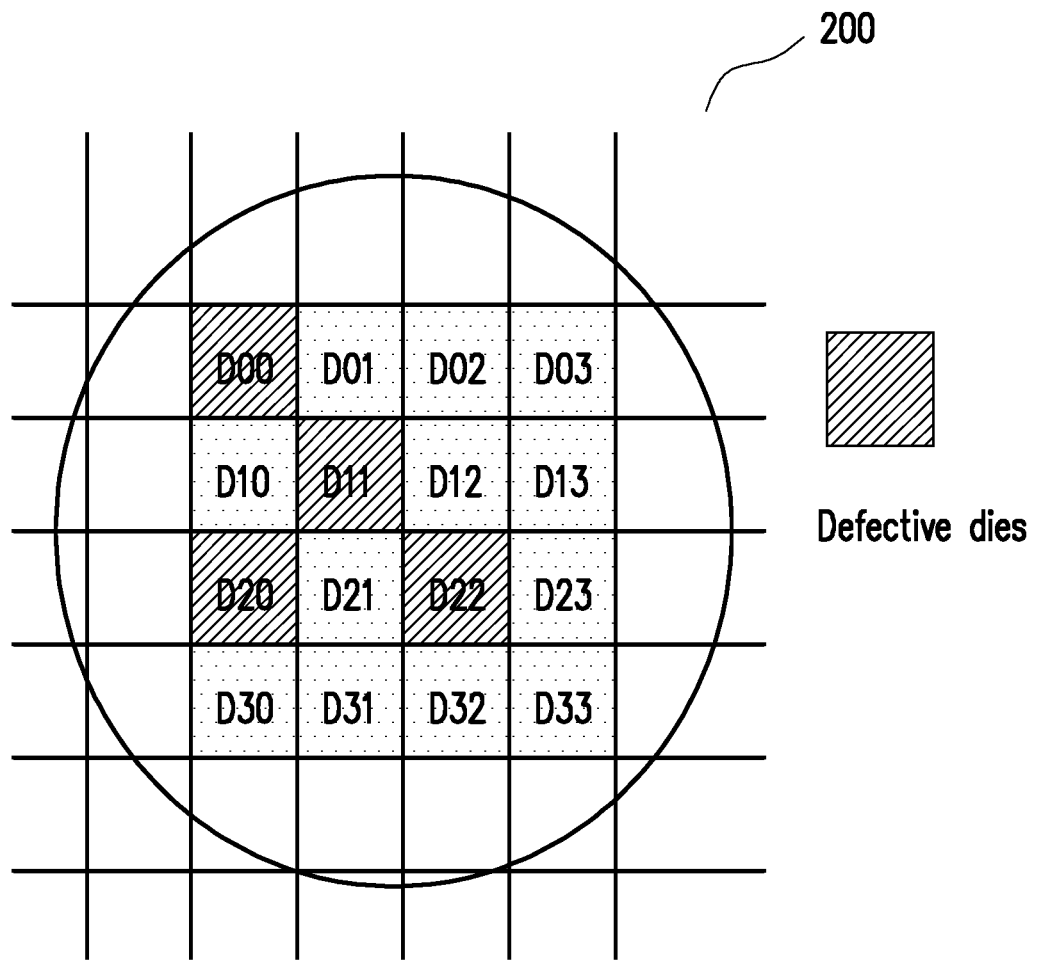
FIG. 3 illustrates defective dies of the example wafer, in accordance with some embodiments.

FIG. 2 illustrates an example wafer 200 with sixteen dies. The dies in the example wafer 200 are represented by D00-D33. A circuit of example test wafer 200 contains five types of scan cells, i.e. the cell type 1, the cell type 2, the cell type 3, the cell type 4, and the cell type 5. In example test wafer 200, two of the five cell types (i.e. the cell type 3 and the cell type 5) are defective and because of these defective cell types some of the dies are defective as well. The defective dies are shown in FIG. 3.

In embodiments, the disclosed technique is implemented to identify the defective cell types of example test wafer 200. For example, first, one or more scan chains are formed for the scan cells of the circuit of example test wafer 200. Each of the formed scan chain contains scan cells of the same cell type. A test pattern is then applied to each of the formed scan chains. Output for the applied test pattern is collected from the scan chains, and the collected output is compared with an expected output.

Figure 4:
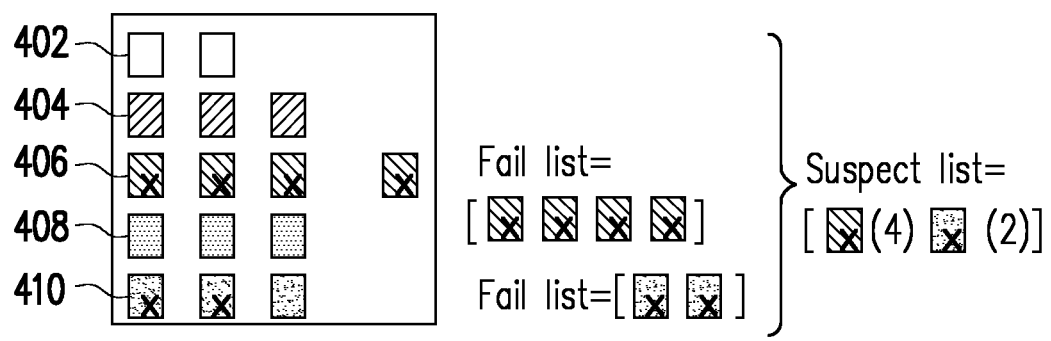
FIG. 4 illustrates the test results of the scan chains of a die in the example wafer, in accordance with some embodiments.
Figure 5A:
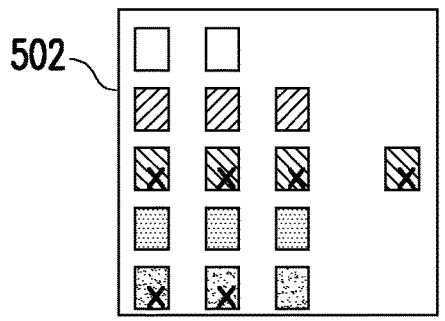
FIGS. 5A-5D illustrates the test results for the example scan chains from multiple dies, in accordance with some embodiments.
Figure 5B:
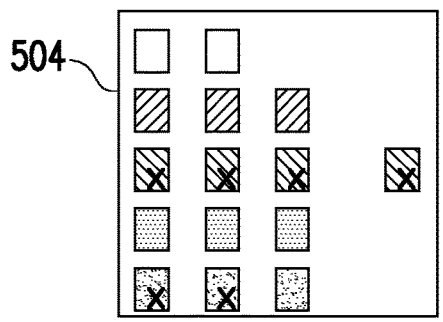
Figure 5C:
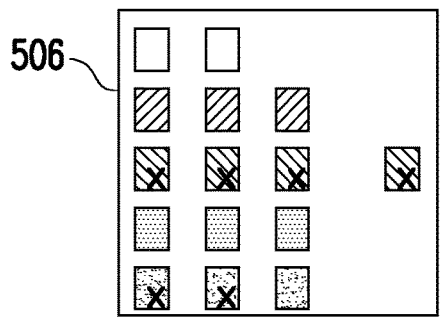
Figure 5D:
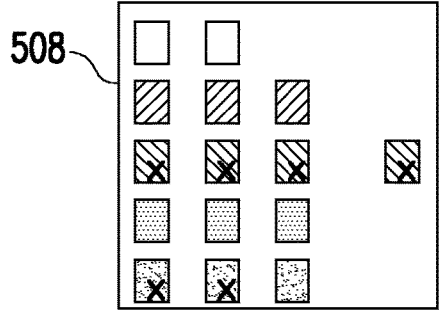

FIG. 4 illustrates, results of the comparison for dies of example test wafer 200 of FIG. 2. During the testing of the circuit of example test wafer 200, any scan chain containing scan cells of the defective cell type 3 and the cell type 5 are expected to fail the test. Since each scan chain is formed to contain scan cells of only one cell type, only the scan chains which contain the defective cell types are expected to fail the test.

For example, and as shown in FIG. 4, scan chain 402 including the cell type 1 scan cells will not fail the test as the cell type 1 is not defective. Similarly, scan chain 404 which includes the cell type 2 (not defective) scan cells will not fail the test as cell type 2 is not defective. In addition, scan chain 408 which includes the cell type 4 (not defective) scan cells will not fail the test.

However, and as shown in FIG. 4, scan chain 406 which includes cell type 3 scan cells will fail the test as the cell type 3 scan cells in the circuit of example test wafer 200 are defective. Since, scan chain 406 fails the test, member scan cells of scan chain 406 are marked as a suspect for being defective. Hence, all scan cells of scan chain 406 are listed on a suspect list for being defective. Similarly, scan chain 410 which includes the cell type 5 (defective) scan cells will fail the test, and all scan chains of scan chain 401 are marked suspect and added to the suspect list.

Thus, using the disclosed technique, that is, by forming scan chains containing scan cells of the same cell type, the defective cell types are easily isolated. For example, for example test wafer 200 of FIG. 2, the cell type 1, the cell type 2, and the cell type 4 will not appear on the suspect list for the defective cell type. Only the cell type 3 (four times) and the cell type 5 (twice) scan cells will appear on the suspect list. Hence, in example embodiments, the scan chains formed with the same type of scan cells provide a better isolation compared to other type of scan chains, even for a single die.

In example embodiments, a confidence level of the defective cell type is increased by increasing a number of circuits of example test wafers 200. For example, more circuits under test can be obtained from multiple dies of example wafer 200 and tested to increase the confidence level of the defective cell type. During testing of the addition circuits, the scan chains containing the defective cell types are expected to fail the test, increasing instances of the defective cell type on the suspect list.

FIG. 5 illustrates the test results of the circuit of example test wafer 200 of FIG. 2 obtained from four different dies by forming the scan chains containing the same cell type of scan cells. For example, FIG. 5(A) illustrates the test results 502 for the test pattern on a first circuit of example test wafer 200 obtained from a first die. FIG. 5(B) illustrates the test results 504 for a second circuit of example test wafer 200 obtained from a second die. FIG. 5(C) illustrates the test results 506 for a third circuit of example test wafer 200 obtained from a third die. FIG. 5(D) illustrates the test results 508 for a fourth circuit of example test wafer 200 obtained from a fourth die. As shown in FIG. 5, for each circuit, during the testing, scan chains containing the defective cell types 3 and 5 fail the scan test, while scan chains containing the cell types 1, 2, and 4 pass the scan test.

In example embodiments, aggregating the test results from multiple dies of example test wafer 200 increases the confidence due to increased frequency. For example, and as shown in FIG. 5, after aggregating the test results from four different dies, the cell type 3 will appear sixteen times and the cell type 5 will appear eight times in the suspect list. In addition, and as shown on FIG. 5, the cell type 1, the cell type 2, and the cell type 4 will not appear on the suspect list as they are not defective in the example wafer of FIG. 2. Hence, an overall probability for the defective cell type increases with increase in number of test wafers.

In examples embodiments, a length of the scan chains can be limited to a predetermined number of scan cells. For example, a maximum number of scan cells to be included in a scan chain can be predefined. In such embodiments, a scan chain containing more scan cells than the predefined maximum number is split into multiple scan chains.

In example embodiments, a scan chain is further broken into multiple scan chains based on physical limitation, such as a distance and hierarchy. For example, if a chain length of a scan chain exceeds more than a predetermined distance from one end of the scan chain to the other, then the scan chain is broken into two or more scan chains of smaller lengths. In another example, a scan chain is broken into multiple scan chains based on clock limitations. For example, if a scan chain contains more scan cells than a maximum capacity of the clock input, the scan chain is broken into two or more scan chains of smaller lengths.

FIG. 6A illustrates example scan chains each containing scan cells of the same cell type. For example, and as shown in FIG. 6A, scan chain 602 contains two scan cells of the cell type 1; scan chain 604 contains three scan cells of the cell type 2; scan chain 606 contains four scan cells of the cell type 3; scan chain 608 contains three scan cells of the cell type 4; and scan chain 610 contains three scan cells of the cell type 5.

In example scan chains of FIG. 6A, if a maximum chain length is limited to three scan cells, the scan chains containing more than three scan cells are broken into two or more scan chains each having a chain length of less than or equal to three scan cells. FIG. 6B illustrates new scan chains formed based on the chain length limitation. For example, as shown in FIG. 6B, scan chain 606 is broken into two scan chains (i.e. scan chain 606A and scan chain 606B) each including two scan cells. In example embodiments, scan chain 606 may be broken into a first scan chain having three scan cells and a second scan chain having one scan cell.

In example embodiments, the scan chains are formed to include scan cells of only certain cell types. For example, a scan chain may be restricted to include scan cells of a preselected or predetermined cell type. The predetermined cell type includes a cell type that is associated with a new design, and hence needs to be monitored for weaknesses. In another example, the predetermined cell type includes a cell type that is known to be weaker based on prior design experiences or testing.

Figure 7:
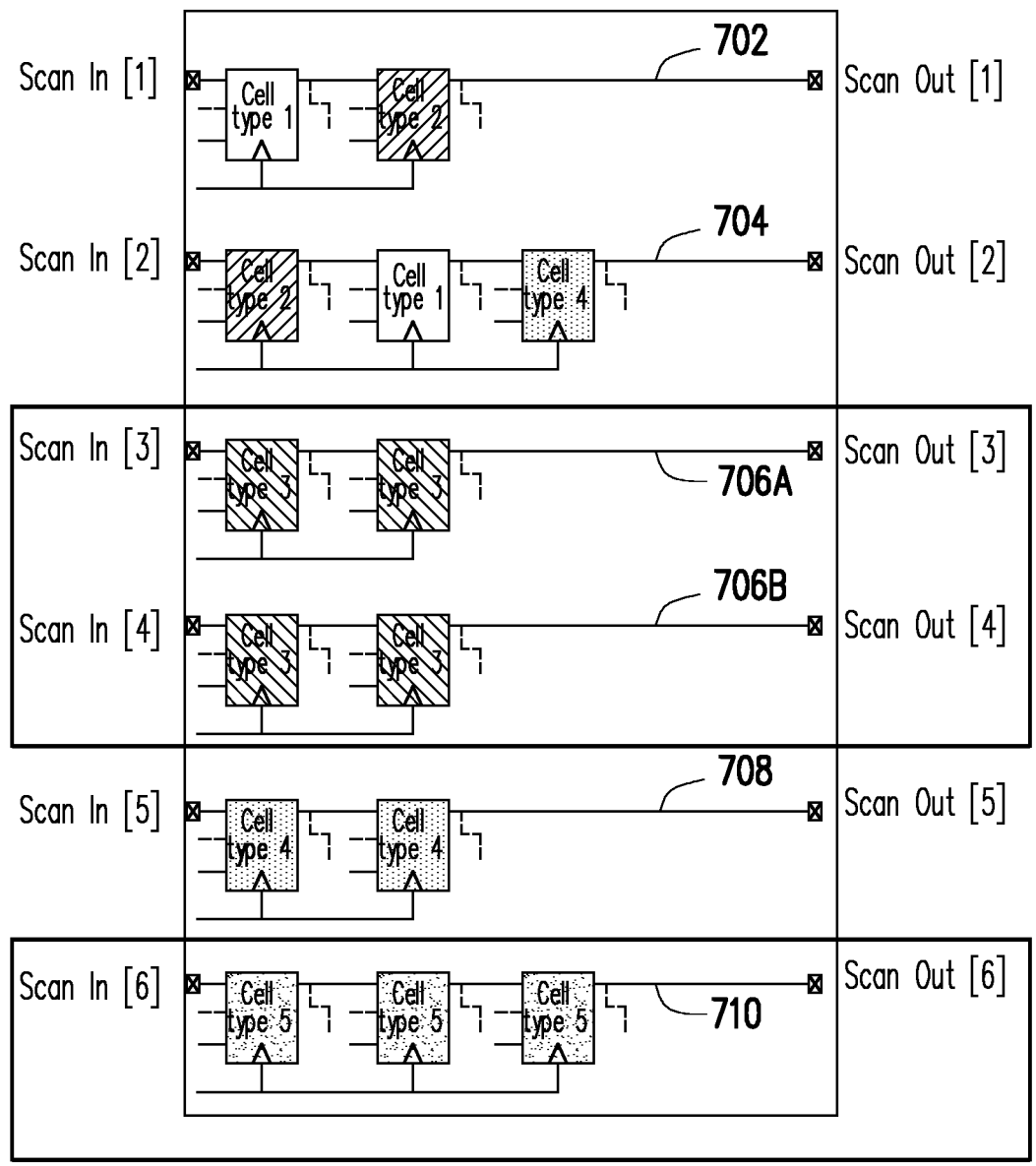
FIG. 7 illustrates an example of unique scan chains, in accordance with some embodiments.

FIG. 7 illustrates an example of the predetermined cell type scan chains. For example, FIG. 7 illustrates scan chain 702, scan chain 704, scan chain 706A, scan chain 706B, scan chain 708, and scan chain 710, of which scan chains 706 and 710 are the predetermined cell type scan chains. For example, and as shown in FIG. 7, scan chains 706A and 706B contain scan cells of the cell type 3 and scan chain 710 contains scan cells of the cell type 5. In example embodiments, scan chains 706A and 706B contain scan cells of the cell type 3 which are known to be weaker based on prior testing. Similarly, scan chain 710 contains the cell type 5 scan cells which are new in design and therefore need to be monitored.

The rest of the scan chains, i.e. scan chains 702, 704, and 708 are permitted to include scan cells of the mixed cell types. For example, and as shown in FIG. 7, scan chain 702 includes scan cells of the cell type 1 and cell type 2, scan chain 704 includes scan cells of the cell type 1, the cell type 2, and the cell type 4, while scan chain 708 includes scan cells of the cell type 4 only. In example embodiments, the disclosure provides for incremental mixing of cell types in the scan chains. The incremental mixing is used to calculate a ranking of scan cells as well as to detect an inter cell defect. In example embodiments, the ranking is determined by frequency of failure of scan cells in testing of multiple dies. That is a particular cell type is ranked higher or lower than another cell type if the particular cell type is more prone to systematic defect than the another cell type. The inter cell defect includes errors in the transfer of data from an output of a first scan cell to an input of a second scan cell.

Figures 8A, 8B:
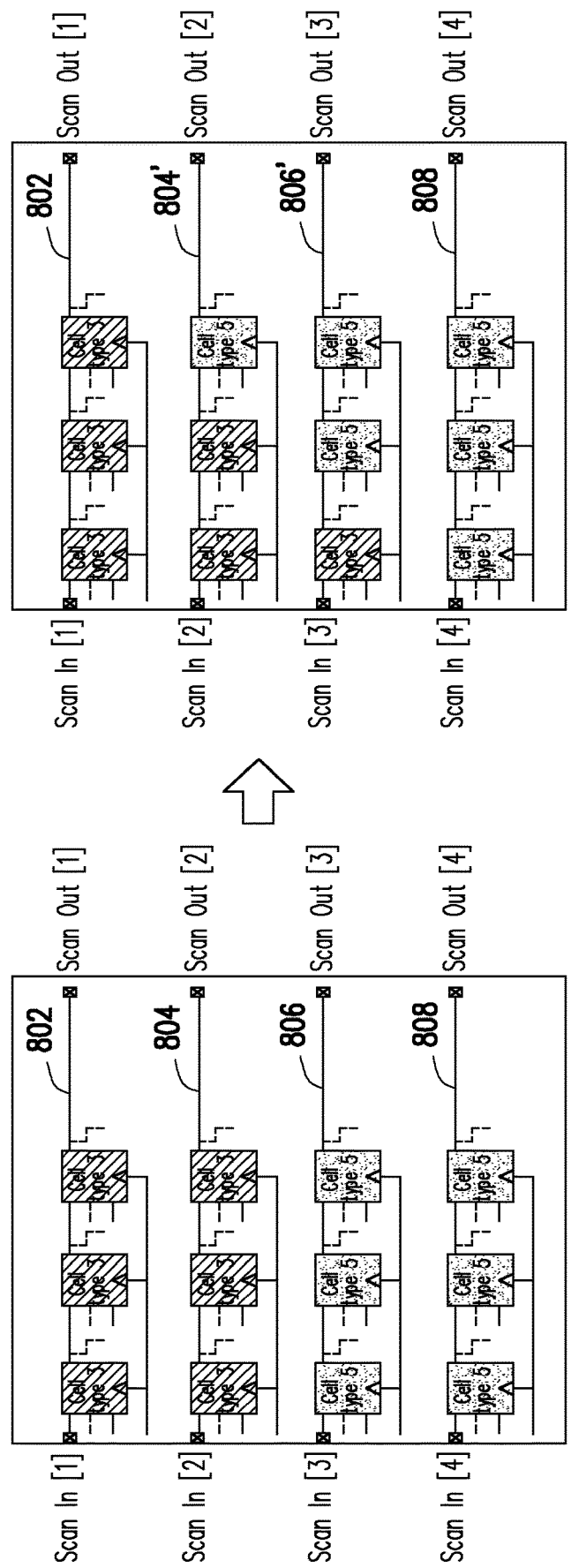
FIGS. 8A-8B illustrates an example of incremental mixing of the scan chains, in accordance with some embodiments.

FIG. 8 illustrate an example of the incremental mixing. FIG. 8A shows four scan chains 802, 804, 806, and 808 each including scan cells of the same cell type. For example, and as shown in FIG. 8A, scan chains 802 and 804 include the cell type 3 scan cells and scan chains 806 and 808 include the cell type 5 scan cells. During incremental mixing, one or more scan cells from a first scan chain is swapped with a scan cell of another chain.

FIG. 8B shows the scan chains formed after incremental mixing of the scan chains of FIG. 8A. For example, during the incremental mixing, a scan cell from scan chain 804 is swapped with a scan cell from scan chain 806. After the example incremental mixing, and as shown in FIG. 8B, scan chain 804' includes both the cell type 3 and the cell type 5 scan cells. Similarly, after the incremental mixing, scan chain 806' includes both the cell type 3 and the cell type 5 scan cells. Other scan, chains i.e. scan chains 802 and 808, continue to contain the cell type 1 and the cell type 4 scan cells. In example embodiments, the incremental mixing can include simply adding more scan cells to an existing scan chain. The new scan chain formed after the incremental mixing is tested to determine a cell-dependent defect. For example, the incrementally mixed scan chains 804' and 806' can be tested to determine the cell-dependent defect between cell type 3 and cell type 5.

Figure 9:
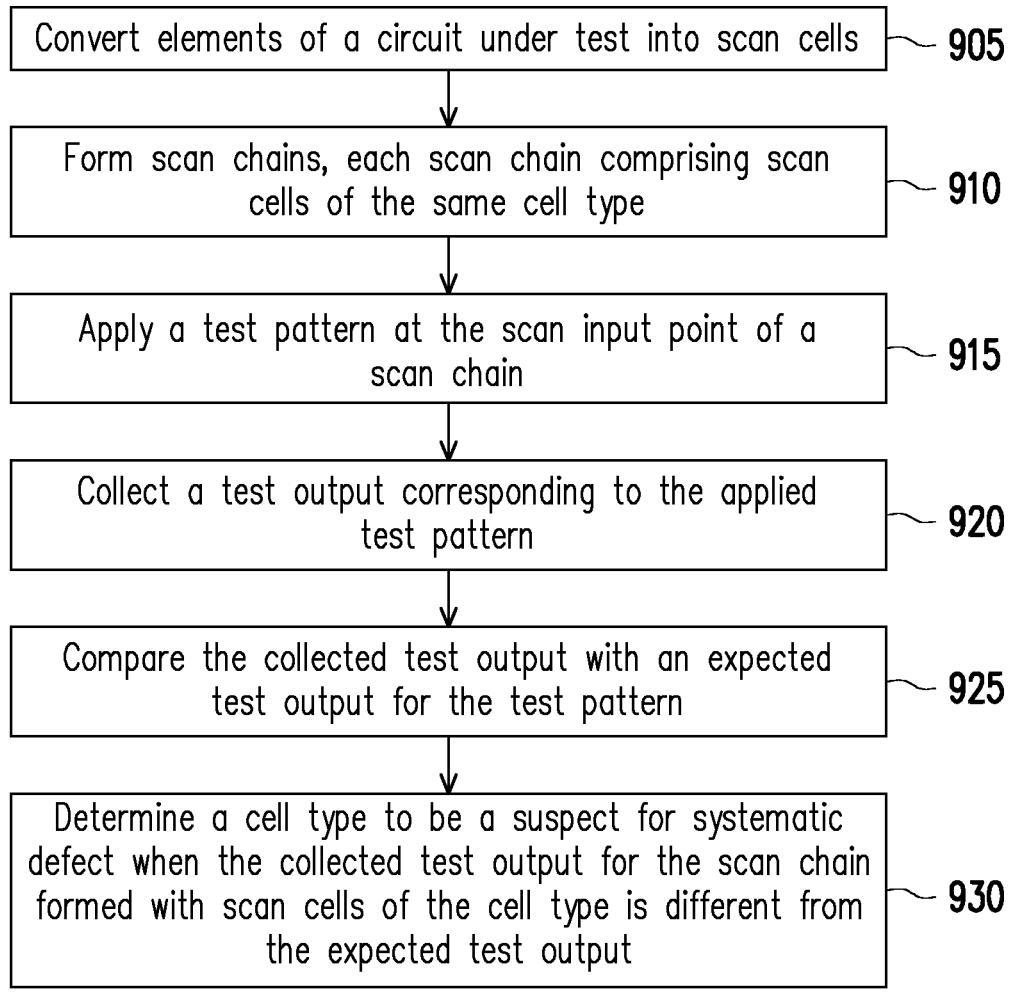
FIG. 9 illustrates an exemplary flow diagram illustrating steps of a method for determining a systematic fault in a circuit under test.

FIG. 9 illustrates operations of a method 900 for determining a systematic defect in a circuit under test. For example, method 900 may be used to determine systematic defects in a very large scale integration (VLSI) circuit. With reference now to FIG. 9, at operation 905 of method 900, elements of the circuit under test are converted into scan cells. For example and as described above, flip flops are converted into scan flops. The scan cells include a scan input, a scan enable, and a scan output. In examples, the scan cells may include more than one input, more than one scan enable, and more than one scan output.

At operation 910 of method 900, one or more scan chains are formed using the scan cells. For example, the scan chains are formed by connecting the scan output of a first scan cell to the scan input of a second scan cell. The scan enable points of the first scan cell and the second scan cell are connected to a common point, and so forth. Each scan chain contains scan cells of the same cell type. In addition, each scans chain contains a scan input, a scan output, and at least one scan enable.

At operation 915 of method 900, a test pattern is applied to the scan input of the scan chain. For example, and as described above, the test pattern includes a string of binary digits. Scan chain is operable to provide an expected output for the applied test pattern.

At operation 920 of method 900, a test output corresponding to the applied test pattern is collected. For example, the test output is collected at the scan output of the scan chain. At operation 925 of method 900, the collected test output is compared with the expected output for the test pattern.

At operation 930 of method 900, a cell type is determined to be a suspect for the systematic defect when the collected test output is different than the expected output for the scan chain formed using scan cells of that cell type. In example embodiments, more test pattern may be applied to the circuit under the test obtained from different dies to increase the confidence for the suspect.

Figure 10:
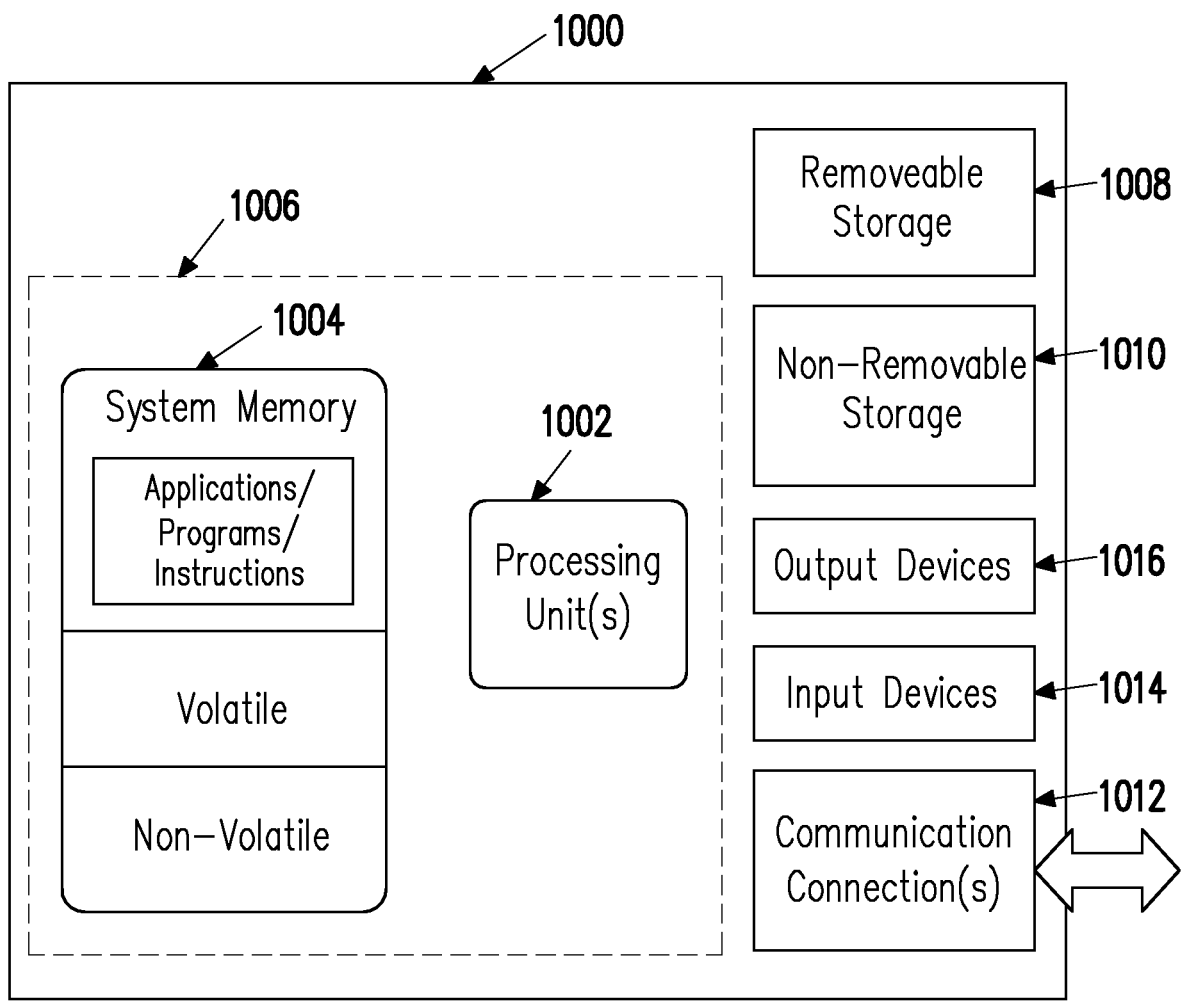
FIG. 10 illustrates one example of a suitable operating environment in which one or more of the present examples may be implemented.

FIG. 10 and the additional discussion in the present specification are intended to provide a brief general description of a suitable computing environment in which the present disclosure and/or portions thereof may be implemented. Although not required, the embodiments described herein may be implemented as computer-executable instructions, such as by program modules, being executed by a computer, such as a client workstation or a server. Generally, program modules include routines, programs, objects, components, data structures and the like that perform particular tasks or implement particular abstract data types. Moreover, it should be appreciated that the invention and/or portions thereof may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

FIG. 10 illustrates one example of a suitable operating environment 1000 in which one or more of the present embodiments may be implemented. This is only one example of a suitable operating environment and is not intended to suggest any limitation as to the scope of use or functionality. Other well-known computing systems, environments, and/or configurations that may be suitable for use include, but are not limited to, personal computers, server computers, hand-held or laptop devices, multiprocessor systems, microprocessor-based systems, programmable consumer electronics such as smart phones, network PCs, minicomputers, mainframe computers, distributed computing environments that include any of the above systems or devices, and the like.

In its most basic configuration, operating environment 1000 typically may include at least one processing unit 1002 and memory 1004. Depending on the exact configuration and type of computing device, memory 1004 (storing, among other things, APIs, programs, etc. and/or other components or instructions to implement or perform the system and methods disclosed herein, etc.) may be volatile (such as RAM), non-volatile (such as ROM, flash memory, etc.), or some combination of the two. This most basic configuration is illustrated in FIG. 10 by dashed line 1006. Further, environment 1000 may also include storage devices (removable, 1008, and/or non-removable, 1010) including, but not limited to, magnetic or optical disks or tape. Similarly, environment 1000 may also have input device(s) 1014 such as a keyboard, mouse, pen, voice input, etc. and/or output device(s) 1016 such as a display, speakers, printer, etc. Also included in the environment may be one or more communication connections, 1012, such as LAN, WAN, point to point, etc.

Operating environment 1000 may include at least some form of computer readable media. The computer readable media may be any available media that can be accessed by processing unit 1002 or other devices comprising the operating environment. For example, the computer readable media may include computer storage media and communication media. The computer storage media may include volatile and nonvolatile, removable and non-removable media implemented in any method or technology for storage of information such as computer readable instructions, data structures, program modules or other data. The computer storage media may include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transitory medium which can be used to store the desired information. The computer storage media may not include communication media.

The communication media may embody computer readable instructions, data structures, program modules, or other data in a modulated data signal such as a carrier wave or other transport mechanism and includes any information delivery media. The term "modulated data signal" may mean a signal that has one or more of its characteristics set or changed in such a manner as to encode information in the signal. For example, the communication media may include a wired media such as a wired network or direct-wired connection, and wireless media such as acoustic, RF, infrared and other wireless media. Combinations of any of the above should also be included within the scope of computer readable media.

Operating environment 1000 may be a single computer operating in a networked environment using logical connections to one or more remote computers. The remote computer may be a personal computer, a server, a router, a network PC, a peer device or other common network node, and typically includes many or all of the elements described above as well as others not so mentioned. The logical connections may include any method supported by available communications media. Such networking environments are commonplace in offices, enterprise-wide computer networks, intranets and the Internet.

The different aspects described herein may be employed using software, hardware, or a combination of software and hardware to implement and perform the systems and methods disclosed herein. Although specific devices have been recited throughout the disclosure as performing specific functions, one skilled in the art will appreciate that these devices are provided for illustrative purposes, and other devices may be employed to perform the functionality disclosed herein without departing from the scope of the disclosure.

As stated above, a number of program modules and data files may be stored in system memory 1004. While executing on processing unit 1002, program modules 1008 (e.g., applications, Input/Output (I/O) management, and other utilities) may perform processes including, but not limited to, one or more of the stages of the operational methods described herein such as method 900 illustrated in FIG. 9 for example.

Furthermore, examples of the invention may be practiced in an electrical circuit comprising discrete electronic elements, packaged or integrated electronic chips containing logic gates, a circuit utilizing a microprocessor, or on a single chip containing electronic elements or microprocessors. For example, examples of the invention may be practiced via a system-on-a-chip (SOC) where each or many of the components illustrated in FIG. 10 may be integrated onto a single integrated circuit. Such an SOC device may include one or more processing units, graphics units, communications units, system virtualization units and various application functionality all of which are integrated (or "burned") onto the chip substrate as a single integrated circuit. When operating via an SOC, the functionality described herein may be operated via application-specific logic integrated with other components of the operating environment 1000 on the single integrated circuit (chip). Examples of the present disclosure may also be practiced using other technologies capable of performing logical operations such as, for example, AND, OR, and NOT, including but not limited to mechanical, optical, fluidic, and quantum technologies. In addition, examples of the invention may be practiced within a general purpose computer or in any other circuits or systems.

In example embodiments, any of the methods, apparatus, and systems described herein can be used in conjunction with a wide variety of scan-based or partially-scan-based circuits and in connection with a wide variety of diagnostic procedures. Moreover, disclosed methods, apparatus, and systems may be utilized to determine fault types associated with the identified systematic defects. The fault types may include, for example, stuck-at faults, transition faults, hold-time faults, and other faults. Further, fault types identified using test sets generated according to the disclosed techniques need not be of a particular type, but can vary from implementation to implementation.

According to an embodiment, a method for determining a systematic defect in a circuit under test is provided. Elements of the circuit under test into scan cells. A first scan chain that includes a first plurality of scan cells is formed. Each scan cell of the first plurality of scan cells of the first scan chain are of a first cell type. The first scan chain contains a first scan input and a first scan output. A first test pattern is applied at the scan input and a first test output is collected for the applied first test pattern at the first scan output. The collected first test output is compared with a first expected test output. The first cell type is marked to be a suspect for a systematic defect when the first test output is different from the first expected test output.

According to an embodiment, a non-transitory computer-readable medium that stores a set of instructions which when executed perform a method is provided. The method includes transforming elements of a first circuit under test into scan cells by enabling a scan input and a scan output for the elements. The method further includes forming a first scan chain having a first plurality of scan cells of a first cell type. The first scan chain is formed by connecting the scan output of a first scan cell to the scan input of a second scan cell. The first scan chain includes a first scan input and a first scan output. The method further includes applying a first test pattern at the scan input of the first scan chain; comparing a first test result corresponding to the first test pattern obtained with a first expected test result; and determining the first cell type to be a suspect for a systematic defect when the first test result is different from the first expected test result.

According to an embodiment, an apparatus for determining a systematic defect is provided. The apparatus includes a memory storage and a processing unit coupled to the memory storage. The processing unit is operative to convert elements of a circuit under test into scan cells and form a first scan chain having a first plurality of scan cells. Each scan cell of the first plurality of scan cells of the first scan chain are of a first cell type. The first scan chain includes a first scan input and a first scan output. The processing unit is further operative to apply a first test pattern at the scan input of the first scan chain and collect a first test result for the applied first test pattern at the first scan output. The collected first test result is compared by the processing unit with a first expected test result for the first test pattern. The processing unit is operative to determine the first cell type to be a suspect for a systematic defect when the first test result is different from the first expected test result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining a systematic defect in a first circuit under test, the method comprising:
converting elements of a circuit under test into scan cells;
forming a first scan chain comprising a first plurality of scan cells selected from the scan cells converted from the elements of the circuit under test, wherein each scan cell of the first plurality of scan cells of the first scan chain are of a first cell type, and wherein the first scan chain comprises a first scan input and a first scan output;
applying a first test pattern at the scan input of the first scan chain;
collecting a first test output for the first test pattern at the first scan output of the first scan chain;
comparing the first test output with a first expected test output for the first test pattern; and
determining, when the first test output is different from the first expected test output, the first cell type to be a suspect for a systematic defect.

2. The method of claim 1, further comprising:
forming a second scan chain comprising a second plurality of scan cells selected from the scan cell converted from the elements of the circuit under test, wherein each scan cell of the second plurality of scan cells of the second scan chain are of a second cell type, and wherein the second scan chain comprises a second scan input and a second scan output;
applying a second test pattern at the second scan input of the second scan chain;
receiving a second test output for the second test pattern at the second scan output of the second scan chain;
comparing the second test output with a second expected test output for the second test pattern; and
determining, when the second test output is same as the second expected test output, the second cell type not to be a suspect for the systematic defect.

3. The method of claim 1, wherein the circuit under test is obtained from a first die, and wherein the method further comprises:
determining the systematic defect for the circuit under test obtained from at least one second die; and
aggregating the suspect obtained for the circuit under test obtained from the at least one second die with the suspect for the circuit under test obtained from the first die.

4. The method of claim 1, further comprising splitting the first scan chain into two or more scan chains when a number of the first plurality of scan cells is more than a predetermined number.

5. The method of claim 1, wherein forming the first scan chain comprises forming the first scan chain comprising the first plurality of scan cells of the first cell type comprising a predetermined cell design.

6. The method of claim 1, wherein forming the first scan chain comprises forming the first scan chain comprising the first plurality of scan cells of the first cell type comprising a suspect scan cell design.

7. The method of claim 1, further comprising incrementally mixing at least one scan cell of a second cell type into the first scan chain.

8. The method of claim 1, further comprising:
fixing the systematic defect associated with the first cell type; and
determining whether a second plurality of scan cells of a second cell type contain the systematic defect.

9. The method of claim 1, further comprising:
forming a second scan chain comprising a second plurality of scan cells, wherein at least one scan cell of the second plurality of scan cell is of a second cell type and at least one other scan cell of the second plurality of scan cell is of a third cell type.

10. A non-transitory computer-readable medium that stores a set of instructions which when executed perform a method executed by the set of instructions comprising:
transforming elements of a circuit under test into scan cells, wherein transforming the elements comprises enabling a scan input and a scan output for the elements;
forming a first scan chain comprising a first plurality of scan cells of a first cell type, wherein forming the first scan chain comprises connecting the scan output of a first scan cell to the scan input of a second san cell;
determining that the first cell type not to be a suspect for a systematic defect;
swapping, one scan cell of the first scan chain with another scan cell of a second scan chain, wherein the another scan cell is of a second cell type; and
testing, after the swapping, the first scan chain to determine a cell-dependent defect.

11. The non-transitory computer-readable medium of claim 10, wherein the method further comprising splitting the first scan chain into multiple scan chains when a number of the first plurality of scan cells is more than a predetermined number.

12. The non-transitory computer-readable medium of claim 10, wherein the method further comprising forming the first scan chain comprises forming the first scan chain comprising the first plurality of scan cells of the first cell type comprising a predetermined scan cell design.

13. The non-transitory computer-readable medium of claim 10, wherein the method further comprising forming the first scan chain comprises forming the first scan chain comprising the first plurality of scan cells of the first cell type comprising a suspect scan cell design.

14. The non-transitory computer-readable medium of claim 10, wherein the method further comprising incrementally mixing at least one scan cell of a different cell type into the first scan chain.

15. The non-transitory computer-readable medium of claim 10, wherein the method further comprising:
masking the scan cells of the first cell type; and
determining whether a second plurality of scan cells of a second cell type contain the systematic defect.

16. The non-transitory computer-readable medium of claim 10, wherein the circuit under the test is obtained from a first die, and wherein the method further comprising:
determining the systematic defect for the circuit under test obtained from at least one second die; and
aggregating the suspect obtained for the circuit under test obtained from the at least one second die with the suspect for the circuit under test obtained from the first die.

17. An apparatus for determining a systematic defect in a circuit under test, the apparatus comprising:
a memory storage; and
a processing unit coupled to the memory storage, wherein the processing unit is operative to:
form a first scan chain comprising a first plurality of scan cells, wherein each scan cell of the first plurality of scan cells of the first scan chain are of a first cell type;
determine whether the first cell type is a suspect for a systematic defect;
mask, in response to determining that the first cell type is not a suspect for the systematic defect, the first plurality of scan cells of the first scan chain;
form a second scan chain comprising a second plurality of scan cells, wherein the second scan chain comprises of at least one scan cell of a second cell type; and
determine that the second scan chain is a suspect for the systematic defect.

18. The apparatus of claim 17, wherein the second scan chain comprises mixed scan cells of the first cell type and the second cell type.

19. The apparatus of claim 17, wherein the processor being further operative to convert elements of the circuit under test into the first plurality of scan cells and the second plurality of can cells.

20. The apparatus of claim 17, wherein the first cell type comprises a suspect scan cell design based on a prior testing.

* * * * *